United States Patent
Shinozaki et al.

(10) Patent No.: US 6,475,641 B2
(45) Date of Patent: Nov. 5, 2002

(54) CONNECTING MATERIAL AND CONNECTION STRUCTURE

(75) Inventors: Junji Shinozaki, Kanuma (JP); Motohide Takeichi, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/863,288

(22) Filed: May 24, 2001

(65) Prior Publication Data

US 2002/0009597 A1 Jan. 24, 2002

(30) Foreign Application Priority Data

Jun. 1, 2000 (JP) ........................................ 2000-165091

(51) Int. Cl.$^7$ .............................................. B32B 15/08
(52) U.S. Cl. ...................... 428/626; 252/512; 252/513; 252/514; 252/515; 523/457; 523/458; 523/459; 523/460
(58) Field of Search ................................ 523/457, 458, 523/459; 428/460, 626; 528/94, 96, 102; 252/512, 513, 514, 515; 257/741, 746, 783

(56) References Cited

U.S. PATENT DOCUMENTS 4,696,764 A * 9/1987 Yamazaki ................... 252/503

* cited by examiner

Primary Examiner—Robert Dawson
Assistant Examiner—D. Aylward
(74) Attorney, Agent, or Firm—Oliff & Berridge, PLC

(57) ABSTRACT

A connecting material that can be used in the mounting of semiconductor devices on a circuit substrate for semiconductor devices, contains the following components A to C:

(A) an epoxy resin;
(B) a phenol compound having two or more phenolic hydroxyl groups; and
(C) a latent curing agent, where it is preferred that if the ratio of the number of phenolic hydroxyl group equivalents of the phenol compound of component B to the number of epoxy equivalents of the epoxy resin in the connecting material is 0.2 to 1.0.

15 Claims, No Drawings

CONNECTING MATERIAL AND CONNECTION STRUCTURE

BACKGROUND OF THE INVENTION

1. Field of the Invention

The present invention relates to a connecting material that is useful when mounting semiconductor devices such as an LSI circuit on a circuit substrate for mounting semiconductor devices.

2. Description of the Related Art

When semiconductor devices such as an LSI circuit is mounted on a circuit substrate for mounting semiconductor devices, a paste- or film-form insulating connecting material, or an anisotropically electroconductive connecting material in which electroconductive particles are dispersed in this insulating connecting material, is sandwiched between the bump electrode of the semiconductor device and the electrode of the circuit substrate, and this assembly is heat-cured under pressure, thereby connecting the materials together, and yielding a connection structure.

Epoxy-based insulating connecting materials composed of an epoxy resin and an imidazole-based latent curing agent are commonly used as this insulating connecting material.

However, when a conventional insulating connecting material, or an anisotropically electroconductive connecting material in which electroconductive particles are dispersed in this insulating connecting material, is used in the mounting of a semiconductor device on a circuit substrate for mounting semiconductor devices, the connecting material sometimes absorbs moisture during the storage of the resulting connection structure, and when the structure is put in a solder reflow furnace at about 240° C. after this moisture has been absorbed, the moisture that has infiltrated the connecting material expands, bursting the material in some cases (popcorning), creating a separation at the interface between the semiconductor device and the connecting material, and greatly lowering the connection reliability.

SUMMARY OF THE INVENTION

It is an object of the present invention to provide a connecting material that can be used in the mounting of a semiconductor device on a circuit substrate for semiconductor devices, and that can prevent a decrease in connection reliability even when the connecting material absorbs moisture during the storage of the resulting connection structure and is then put in a solder reflow furnace at about 240° C.

The inventors arrived at the present invention upon discovering that if the shrinkage of an epoxy-based connecting material is suppressed during heat curing by adding a phenol compound having two or more phenolic hydroxyl groups in the connection of a circuit substrate and a semiconductor device using a connecting material, then there will be no decrease in connection reliability even when the connection structure is put in a solder reflow furnace at about 240° C. after having been stored under humid conditions.

Specifically, the present invention provides a connecting material, comprising the following components A to C:

(A) an epoxy resin;
(B) a phenol compound having two or more phenolic hydroxyl groups; and
(C) a latent curing agent.

The present invention also provides a connection structure characterized in that opposing electrodes are connected together with this connecting material.

DETAILED DESCRIPTION OF THE INVENTION

The present invention will now be described in detail.

The present invention is a connecting material including an epoxy resin (component A) and a latent curing agent (component C), characterized by containing a phenol compound having two or more phenolic hydroxyl groups as a component B. The phenol compound having two or more phenolic hydroxyl groups used as component B here reacts with the epoxy resin during the heat curing of the connecting material, increases the hardness of the connecting material and improves its adhesive strength, and furthermore suppresses the shrinkage of the connecting material. Therefore, the infiltration of moisture into the connecting material can be greatly suppressed even when the connection structure is stored under humid conditions. Accordingly, even when the connection structure is heated in a solder reflow furnace, swelling and bursting caused by moisture can be greatly suppressed and connection reliability enhanced.

If the ratio of the number of phenolic hydroxyl group equivalents of the phenol compound to the number of epoxy equivalents of the epoxy resin in the connecting material of the present invention is too small (that is, if there are relatively too few phenolic hydroxyl groups), there will be a tendency, for instance, for adhesive strength to decrease at the semiconductor device interface when a semiconductor device and a circuit substrate are connected with the connecting material, but on the other hand, if this ratio is too large (that is, if there are relatively too many phenolic hydroxyl groups), adhesive strength at the semiconductor device interface will again decrease, so this ratio should be adjusted to preferably between 0.2 and 1.0, and more preferably between 0.3 and 0.6. In specific terms, when an epoxy resin with an epoxy equivalent weight of 200 g/eq is used in an amount of 400 g in the connecting material, the number of epoxy resin equivalents in the connecting material will be 2, and if the phenol compound of component B with a phenolic hydroxyl group equivalent weight of 100 g/eq is used in an amount of 100 g in the connecting material, the number of phenolic hydroxyl group equivalents in the connecting material will be 1. Therefore, the ratio of the number of phenolic hydroxyl group equivalents of the phenol compound of component B to the number of epoxy equivalents of the epoxy resin in this case will be 0.5.

In determining the epoxy equivalents here, when the latent curing agent contains an epoxy resin, as discussed below, the epoxy equivalents of the epoxy resin of that portion also have to be added to the total. Specifically, the epoxy equivalents, when compared to the phenolic hydroxyl group equivalents of the phenol compound, encompass not just those of the epoxy resin of component A, but the total epoxy equivalents including those of epoxy resins contained in other components (such as the latent curing agent of component C).

Any compound that has been used as a film forming component in a known thermosetting adhesive (such as an insulating thermosetting adhesive for an anisotropically electroconductive adhesive) can be used favorably as the epoxy resin of component A to be used in the present invention. In particular, when film formability, film strength, and other such factors are considered, two or more types of epoxy resin may be used together, such as a high molecular weight epoxy resin that is a solid at normal temperature and an epoxy resin that is a liquid at normal temperature. A flexible epoxy resin may also be used concurrently. Examples of solid, high molecular weight epoxy resins include phenol novolac type epoxy resins, cresol novolac type epoxy resins, epoxy resins whose main skeleton is dicyclopentadiene, bisphenol A or F type macromolecules, and these epoxy resins that have been modified. Examples of epoxy resins that are a liquid at normal temperature include bisphenol A or F type epoxy resins. Examples of flexible epoxy resins include dimeric acid modified epoxy resins, epoxy resins whose main skeleton is propylene glycol, and urethane modified epoxy resins.

If the epoxy equivalent weight (g/ep) of the epoxy resin of component A is too small, there will be more curing shrinkage and internal stress, but if it is too large, cohesive strength will drop and the connection reliability of the cured product (the connected structure) will be lower, so the preferred range is 100 to 500, with 200 to 400 being even better. The epoxy equivalent weight when a plurality of epoxy resins is used will correspond to the sum of the products of multiplying the epoxy equivalents of the various epoxy resins by the weight ratio of the various epoxy resins in the total epoxy resin.

Examples of the phenol compound having two or more phenolic hydroxyl groups used in the present invention may include bisphenol A, bisphenol F, and other such monomers, phenol novolac resins, cresol novolac resins, and other such oligomers, and polyvinyl phenol resins and other such polymers. of these, novolac type phenol resins are preferred.

If the phenolic hydroxyl group equivalent weight (g/eq) of the phenol compound having two or more phenolic hydroxyl groups is too small, there will be more curing shrinkage and internal stress, but if it is too large, cohesive strength will drop and the connection reliability of the cured product (the connection structure) will be lower, so the preferred range is 50 to 500, with 80 to 400 being even better. The phenolic hydroxyl group equivalent weight when a plurality of phenol compounds having two or more phenolic hydroxyl groups is used will correspond to the sum of the products of multiplying the phenolic hydroxyl group equivalents of the various phenol compounds by the weight ratio of the various phenol compounds in the total phenol compound.

The latent curing agent used in the connecting material of the present invention can be an imidazole-based latent curing agent, amine-based latent curing agent, or the like, which can be used singly or together. Of these, it is preferable to use an imidazole-based latent curing agent because its working (curing) temperature is about 170° C. Using an imidazole-based latent curing agent with such a curing temperature allows the electrode terminals to be securely bonded and electrically connected when the connecting material of the present invention is applied to an anisotropically electroconductive adhesive. Furthermore, the tact time during hot press-bonding can be set to about a few seconds, and good heat resistance can be imparted to the anisotropically electroconductive adhesive.

Any imidazole-based latent curing agent known in the past can be used as the imidazole-based latent curing agent referred to here, but of these, the use of a microencapsulated imidazole-based latent curing agent is preferable. Favorable examples of these microencapsulated imidazole-based latent curing agents include imidazole-based latent curing agents that are microencapsulated by producing an imidazole adduct with a urea or isocyanate compound an d then blocking the surface thereof with an isocyanate compound, and particularly imidazole-based latent curing agents that are microencapsulated by producing an imidazole adduct with an epoxy compound and then blocking the surface thereof with an isocyanate compound.

Heat resistance will suffer and connection reliability will be poor if the imidazole-based latent curing agent is used in too small an amount, but if this amount is too large, there will be a drop in peel strength after hot pressing and storage stability will be poor, so this amount can be 5 to 30 weight parts, and preferably 8 to 20 weight parts, per 100 weight parts of epoxy resin.

The amine-based latent curing agent can be a conventional polyamine-based latent curing agent, tertiary amine-based latent curing agent, or alkylurea-based latent curing agent.

When an amine-based latent curing agent is used, if it is used in too small an amount, there will be a drop in peel strength after hot pressing and connection reliability will be poor, but if the amount is too large, storage stability will be poor, so this amount should be 2 to 40 weight parts, and preferably 5 to 30 weight parts, per 100 weight parts of epoxy resin.

When the connecting material of the present invention is used as an anisotropically electroconductive adhesive, conductive particles such as those used in known anisotropically electroconductive adhesives can be added (such as solder particles, nickel particles, and other such metal particles, or composite particles such as styrene resin particles on whose surface a gold plating film has been formed). The added amount is preferably 2 to 20 vol % in the connecting material.

The connecting material of the present invention can be suitably compounded with any known additives that are compounded with conventional anisotropically electroconductive adhesive films and so forth, such as isocyanate-based crosslinking agents, epoxysilane compounds and other coupling agents, epoxy modified silicone resins, or phenoxy resins and other thermosetting insulating resins. A solvent such as toluene or MEK can also be used as needed.

The connecting material of the present invention can be manufactured by a conventional process. For example, it can be manufactured by uniformly mixing the epoxy resin, the latent curing agent, and the phenol compound having two or more phenolic hydroxyl groups in a solvent such as toluene or MEK.

The connecting material of the present invention can be made into a film and utilized as a thermosetting connecting film. It is particularly useful as an anisotropically electroconnecting film when conductive particles for anisotropically electroconductive connection have been added. In these cases, the finished product can be manufactured by applying the connecting material in the form of a film over a release sheet (such as a polyester sheet) and drying this coating at a temperature at which the connecting material will not undergo a curing reaction.

The connecting material of the present invention can be used in the same ways as a conventional thermosetting adhesive for connecting a pair of opposing electrodes. For instance, the connecting material of the present invention can be situated between a pair of opposing electrodes (such as between a bump electrode for a semiconductor device and an electrode on a circuit substrate for mounting semiconductor device), thermosetting the material by hot or cold pressing, and thereby securely connecting the two electrodes. The connection structure thus obtained loses less of its connection reliability than in the past, even when put into a solder reflow furnace after being stored under high humidity conditions.

EXAMPLES

The present invention will now be described in specific terms on the basis of experimental examples.

Experimental Examples 1 to 19

An epoxy resin with an epoxy equivalent weight of 140 g/eq (HP4032D, made by Dainippon Ink & Chemicals), a novolac type phenol resin with a hydroxyl group equivalent weight of 118 g/eq (VH4170, made by Dainippon Ink & Chemicals), an imidazole-based latent curing agent with an epoxy equivalent weight of 244 g/eq (HX3941HP, made by Asahi Ciba), a phenoxy resin (YP50, made by Toto Kasei), and electroconductive particles (nickel-covered styrene beads, 5 μm in diameter) were mixed while the amounts of the various components were adjusted so that the ratio of phenolic hydroxyl group equivalents to epoxy equivalents (OH/epoxy) would be as shown in Table 1. This mixture was made into a film to produce an anisotropically electroconductive connecting film with a thickness of 40 μm. The electroconductive particles were used in an amount of 12 vol %.

In Table 1, the weight parts of the latent curing agent are the amount per 100 weight parts of epoxy resin.

The anisotropic conductive connecting film thus obtained was stuck onto a circuit substrate (FR5) having a copper pattern (line/space=100 μm/50 μm) with a thickness of 18 μm. To this same side was applied a semiconductor chip (measuring 6.3 mm square, with plating bumps of 110 μm square (bump height: 20 μm), and having aluminum metallization at a 150 μm pitch), and hot press-bonding was performed for 10 seconds at 160° C. and a pressure of 150 g per bump. Hot press-bonding was then performed for 5 seconds at 200° C. and a pressure of 0.3 g per bump to produce a connection structure in which a semiconductor chip was mounted on a circuit substrate.

The conduction resistance (Ω) of the connection structure thus obtained was measured by the four-probe method immediately after production, after pretreatment (in which the structure was allowed to stand for 24 hours at 85° C. and 85% RH, then passed twice through a reflow furnace (highest temperature reached: 240° C.)), and after aging (pressure cooker test (PCT (121° C., 2.0265×10$^2$ kPa, 100% RH, 100 hrs, 200 hrs, or 300 hrs))) or heat cycle test (H/S (−55° C. to 125° C., 250 times, 500 times, 1000 times)). Connection reliability was evaluated for the following criteria using the conduction resistance thus obtained. These results are given in Table 2.

Connection Reliability

| Grade | Criterion |
| --- | --- |
| A: | less than 100 mΩ |
| B: | at least 100 mΩ, less than 1 Ω |
| C: | at least 1 Ω to open state |

The peeling state of the connection portion was observed under a microscope after the aging treatment (300 hours). "I" indicates that peeling occurred between the semiconductor chip and the connecting material, while "−" indicates that no peeling occurred. These results are given in Table 2.

TABLE 1

| Experimental Example | Equivalent ratio (OH/epoxy) | Latent curing agent (weight parts) |
| --- | --- | --- |
| 1 | 0 | 7 |
| 2 | 0 | 15 |
| 3 | 0.1 | 6.5 |
| 4 | 0.1 | 14.5 |
| 5 | 0.2 | 6.5 |
| 6 | 0.2 | 14.5 |
| 7 | 0.4 | 6 |
| 8 | 0.4 | 12 |
| 9 | 0.4 | 14 |
| 10 | 0.4 | 17 |
| 11 | 0.4 | 22 |
| 12 | 0.6 | 6 |
| 13 | 0.6 | 12 |
| 14 | 0.6 | 14 |
| 15 | 0.6 | 17 |
| 16 | 0.6 | 22 |
| 17 | 0.8 | 6 |
| 18 | 0.8 | 14 |
| 19 | 0.8 | 22 |

TABLE 2

| Experimental Ex. | After pre-treatment | After PCT | | | After HC | | | Peeling state |
| --- | --- | --- | --- | --- | --- | --- | --- | --- |
| | | 100 | 200 | 300 | 250 | 500 | 1000 | |
| 1 | B | C | — | — | C | — | — | I |
| 2 | B | C | — | — | C | — | — | I |
| 3 | B | B | C | — | C | — | — | I |
| 4 | B | B | C | — | B | C | — | I |
| 5 | B | B | B | B | B | B | B | — |
| 6 | B | B | B | B | A | B | B | — |
| 7 | A | A | A | A | B | B | B | — |
| 8 | A | A | A | A | A | A | A | — |
| 9 | A | A | A | A | A | A | A | — |
| 10 | A | A | A | A | A | A | A | — |
| 11 | A | A | A | B | A | A | A | — |
| 12 | A | A | A | A | A | B | B | — |
| 13 | A | A | A | A | A | A | A | — |
| 14 | A | A | A | A | A | A | A | — |
| 15 | A | A | A | A | A | A | A | — |
| 16 | A | A | A | B | A | A | A | — |
| 17 | A | A | A | A | B | B | B | — |
| 18 | A | A | A | A | A | B | B | — |
| 19 | A | A | A | B | A | A | B | — |

It can be seen from the results in Experimental examples 1 to 19 that the PCT characteristics are improved when a novolac type phenol resin having two or more phenolic hydroxyl groups is used in the connecting material. It can also be seen from the overall experimental examples that the preferable range for the ratio of the number of phenolic hydroxyl groups to the number of epoxy equivalents of the epoxy resin is from about 0.2 to 1.0.

It can also be seen from Experimental Examples 7 to 19 that the amount in which the imidazole-based latent curing agent is used is preferably about 5 to 30 weight parts per 100 weight parts of epoxy resin.

With the present invention, there will be no decrease in the connection reliability of a connecting material that can be used in the mounting of a semiconductor device on a circuit substrate for semiconductor devices, even when the connecting material absorbs moisture during the storage of the resulting connection structure and is then put in a solder reflow furnace at about 240° C.

The entire disclosure of the specification, claims and summary of Japanese Patent Application No. 2000-165091 filed on Jun. 1, 2000 are hereby incorporated by reference.

What is claimed is:

1. A connecting material, comprising the following components A to C:

(A) an epoxy resin;

(B) a phenol compound having two or more phenolic hydroxyl groups; and (C) a latent curing agent, wherein the ratio of the number of phenolic hydroxyl group equivalents of the phenol compound of component B to the number of epoxy equivalents of the epoxy resin in the connecting material is 0.2 to 1.0.

2. A connecting material according to claim 1, wherein the ratio of the number of phenolic hydroxyl group equivalents of the phenol compound of component B to the number of epoxy equivalents of the epoxy resin in the connecting material is 0.3 to 0.6.

3. A connecting material, comprising the following components A to C:

(A) an epoxy resin;

(B) a phenol compound having two or more phenolic hydroxyl groups; and (C) a latent curing agent, wherein the equivalent weight of the phenolic hydroxyl groups in the phenol compound having two or more phenolic hydroxyl groups of component B is 50 to 500 g/eq.

4. A connecting material according to claim 1, wherein the phenol compound is a novolac type phenol resin.

5. A connecting material according to claim 1, wherein the latent curing agent-of component C is an imidazole-based latent curing agent.

6. A connecting material, comprising the following components A to C:

(A) an epoxy resin;

(B) a phenol compound having two or more phenolic hydroxyl groups; and (C) a latent curing agent, wherein the amount in which the latent curing agent of component C is compounded is 5 to 30 weight parts per 100 weight parts epoxy resin.

7. A connecting material according to claim 1, further containing 2 to 20 vol % electroconductive particles for anisotropically electroconductive connection.

8. A connection structure, comprising a pair of opposing electrodes and a connecting material as defined in claim 1 sandwiched therebetween, these being connected by cold or hot pressing.

9. A connection structure, comprising a pair of opposing electrodes and a connecting material sandwiched therebetween, these being connected by cold or hot pressing, wherein the connecting material comprising the following components A to C:

(A) an epoxy resin;

(B) a phenol compound having two or more phenolic hydroxyl groups; and (C) a latent curing agent, wherein one of the opposing electrodes is a bump electrode for a semiconductor device, and the other is an electrode on a circuit substrate for mounting semiconductor device.

10. A connection structure, comprising a pair of opposing electrodes and a connecting material as defined in claim 2 sandwiched therebetween, these being connected by cold or hot pressing.

11. A connection structure, comprising a pair of opposing electrodes and a connecting material as defined in claim 3 sandwiched therebetween, these being connected by cold or hot pressing.

12. A connection structure, comprising a pair of opposing electrodes and a connecting material as defined in claim 4 sandwiched therebetween, these being connected by cold or hot pressing.

13. A connection structure, comprising a pair of opposing electrodes and a connecting material as defined in claim 5 sandwiched therebetween, these being connected by cold or hot pressing.

14. A connection structure, comprising a pair of opposing electrodes and a connecting material as defined in claim 6 sandwiched therebetween, these being connected by cold or hot pressing.

15. A connection structure, comprising a pair of opposing electrodes and a connecting material as defined in claim 7 sandwiched therebetween, these being connected by cold or hot pressing.

* * * * *